(12) United States Patent  (10) Patent No.: US 8,780,614 B2
Takemura  (45) Date of Patent: Jul. 15, 2014

(54) SEMICONDUCTOR MEMORY DEVICE

(75) Inventor: Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 340 days.

(21) Appl. No.: 13/363,584

(22) Filed: Feb. 1, 2012

(65) Prior Publication Data

US 2012/0195104 A1 Aug. 2, 2012

(30) Foreign Application Priority Data

Feb. 2, 2011 (JP) ................................ 2011-020732

(51) Int. Cl.
*G11C 11/24* (2006.01)
(52) U.S. Cl.
USPC ........................................................ 365/149
(58) Field of Classification Search
USPC ........................................................ 365/149
See application file for complete search history.

(56) References Cited

U.S. PATENT DOCUMENTS

| | | | |
|---|---|---|---|
| 4,777,625 A | | 10/1988 | Sakui et al. |
| 4,926,382 A | * | 5/1990 | Sakui et al. .................. 365/203 |
| 4,982,372 A | | 1/1991 | Matsuo |
| 5,144,583 A | * | 9/1992 | Oowaki et al. ............... 365/206 |
| 5,302,843 A | | 4/1994 | Yamazaki |
| 5,731,856 A | | 3/1998 | Kim et al. |
| 5,744,864 A | | 4/1998 | Cillessen et al. |
| 5,888,868 A | | 3/1999 | Yamazaki et al. |
| 5,976,929 A | * | 11/1999 | Kajigaya et al. ............. 438/241 |
| 6,294,274 B1 | | 9/2001 | Kawazoe et al. |
| 6,563,174 B2 | | 5/2003 | Kawasaki et al. |
| 6,574,148 B2 | | 6/2003 | Chevallier |
| 6,727,522 B1 | | 4/2004 | Kawasaki et al. |

(Continued)

FOREIGN PATENT DOCUMENTS

EP 1 737 044 A1 12/2006
EP 2 226 847 A2 9/2010

(Continued)

OTHER PUBLICATIONS

Asakuma, N. et al., "Crystallization and Reduction of SOL-GEL-Derived Zinc Oxide Films by Irradiation With Ultraviolet Lamp," Journal of SOL-GEL Science and Technology, 2003, vol. 26, pp. 181-184.

(Continued)

*Primary Examiner* — Hoai V Ho
*Assistant Examiner* — Pablo Huerta
(74) *Attorney, Agent, or Firm* — Fish & Richardson P.C.

(57) ABSTRACT

The capacitance of a capacitor that is required in a DRAM is reduced, whereby a highly integrated DRAM is provided. In a divided bit line type DRAM, a sub bit line is formed below a word line and a bit line is formed above the word line. The parasitic capacitance of the sub bit line is reduced by employing the divided bit line method, and further, the off resistance of a cell transistor is set high according to need; thus, the capacitance can be one tenth or less of that of a conventional DRAM. Accordingly, even when a stacked capacitor is employed, the height of the capacitor can be one tenth or less of that of a conventional one, so that a bit line can be easily provided thereover. Further, by devising a structure of the cell transistor, the area per memory cell can be reduced to 4 $F^2$.

19 Claims, 9 Drawing Sheets

(56) References Cited

U.S. PATENT DOCUMENTS

| | | | |
|---|---|---|---|
| 6,831,852 B2 * | 12/2004 | Ishigaki et al. | 365/149 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,088,603 B2 | 8/2006 | Patel | |
| 7,105,868 B2 | 9/2006 | Nause et al. | |
| 7,183,603 B2 * | 2/2007 | Park | 257/298 |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,715,246 B1 * | 5/2010 | Kim | 365/189.14 |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0266925 A1 | 10/2008 | Lukes et al. | |
| 2008/0285362 A1 * | 11/2008 | Kang et al. | 365/189.16 |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0290262 A1 | 11/2010 | Scheuerlein et al. | |
| 2011/0089419 A1 | 4/2011 | Yamazaki et al. | |
| 2011/0101334 A1 | 5/2011 | Yamazaki et al. | |
| 2011/0114946 A1 | 5/2011 | Saito | |
| 2011/0248324 A1 * | 10/2011 | Kang | 257/295 |
| 2012/0057396 A1 | 3/2012 | Yamazaki et al. | |
| 2012/0063208 A1 | 3/2012 | Koyama et al. | |
| 2012/0063209 A1 | 3/2012 | Koyama et al. | |
| 2012/0075917 A1 | 3/2012 | Takemura | |
| 2012/0081948 A1 | 4/2012 | Takemura | |
| 2012/0112257 A1 | 5/2012 | Kato | |
| 2012/0182790 A1 | 7/2012 | Yamazaki et al. | |
| 2012/0193697 A1 | 8/2012 | Takemura | |
| 2012/0199842 A1 * | 8/2012 | Takemura | 257/76 |

FOREIGN PATENT DOCUMENTS

| | | | |
|---|---|---|---|
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 08-264794 A | 10/1996 | |
| JP | 11-505377 A | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2007-042172 A | 2/2007 | |
| JP | 2007-096055 A | 4/2007 | |
| JP | 2007-123861 A | 5/2007 | |
| WO | 2004/114391 A1 | 12/2004 | |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

(56) References Cited

OTHER PUBLICATIONS

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al.. "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and its Bending Properties," SID Digest '09 : SID International Symposium Digest of Technical Papers, May 31, 2009, pp. 983-985.

Kanno, H et al., "White Stacked Electrophosphoreecnt Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al. "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kim, K, "Technology for sub-50nm DRAM and NAND Flash Manufacturing," IEDM 05: Technical Digest of International Electron Devices Meeting, Dec. 5, 2005, pp. 333-336.

Kimizuka, N. et al., "Spinel,YbFe2O4, and Yb2Fe3O7 Types of Structures for Compounds in the In2O3 and Sc2O3-A2O3-Bo Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3,4,and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Muller, W, "Challenges for the DRAM Cell Scaling to 40nm," IEDM 05: Technical Digest of International Electron Devices Meeting, Dec. 5, 2005, pp. 347-350.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

(56) References Cited

OTHER PUBLICATIONS

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn-Oxide TFTs With a Novel Passivation Layer," SID Digest '09 : SID International Symposium Digest of Technical Papers, May 31, 2009, pp. 284-287.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al.. "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transister for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters, Jul. 31, 2000, vol. 85, No. 5, pp. 1012-1015.

\* cited by examiner

SEMICONDUCTOR MEMORY DEVICE

BACKGROUND OF THE INVENTION

1. Field of the Invention

The present invention relates to a semiconductor memory device.

2. Description of the Related Art

A DRAM whose memory cell includes one transistor (cell transistor) and one capacitor can be highly integrated, has no limit on the number of times of writing in principle, and can perform writing and reading at relatively high speed; thus, such a DRAM is used in many kinds of electronic appliances. Various efforts have been made to further increase the degree of integration of a DRAM (see Patent Document 1).

A DRAM stores data by accumulating electric charge in a capacitor of each memory cell, and reads the data by releasing the electric charge to a bit line.

The amount of change in the potential of the bit line due to the release of the electric charge is determined by the ratio between the capacitance of the capacitor and the parasitic capacitance of the bit line. The parasitic capacitance of the bit line is substantially proportional to the length of the bit line. Accordingly, the capacitance of the capacitor should be constant when the length of the bit line is not changed. In a DRAM widely used at present, a capacitor is required to have a capacitance of about 30 fF.

Although the size of a memory cell tends to be reduced as miniaturization proceeds, while an area in which a capacitor is formed is reduced, the capacitor has been required to have the same capacitance as a conventional capacitor because the capacitance of the capacitor needs to be kept at a certain value or more as described above.

At present, a capacitor is formed to have a trench structure in which a deep hole is formed in a silicon wafer or a stack structure in which a chimney-like projection is provided (see Non Patent Documents 1 and 2). Both the hole and the projection are required to have an aspect ratio of 50 or more. That is, an extremely long and narrow structure body whose depth or height is 2 µm or more needs to be formed in a limited area, which is difficult to realize with high yield.

In order to overcome such a difficulty, a method is disclosed in which sub bit lines branched from a bit line are provided and a sense amplifier of a flip-flop circuit type is connected to each of the sub bit lines so that the capacitance of a capacitor is reduced (see Patent Document 2).

However, in a DRAM having a conventional structure, a bit line and a sub bit line are required to overlap with each other over a word line. When a stacked capacitor is employed, thus many structure bodies are provided over a word line, which results in difficulty in circuit design and manufacture.

It is also a problem that when the capacitance of a capacitor is reduced, an interval between refresh operations is correspondingly shortened. For example, when the capacitance is reduced to one tenth, the time during which electric charge is held in the capacitor also becomes one tenth, assuming that the off resistance of a cell transistor is constant; thus, refresh operation needs to be performed at an interval of one tenth as compared with using a conventional capacitor (i.e., at a frequency ten times as high as). Although many proposals related to a divided bit line structure have been made, including Patent Document 2, there seems to be no example which bring a breakthrough in this respect.

REFERENCE

Patent Document

[Patent Document 1] U.S. Pat. No. 5,302,843
[Patent Document 2] U.S. Pat. No. 4,777,625

Non-Patent Document

[Non-Patent Document 1] K. Kim, "Technology for sub-50 nm DRAM and NAND flash manufacturing", *Technical Digest of international Electron Devices Meeting*, pp. 333-336, 2005.

[Non-Patent Document 2] W. Mueller et al., "Challenges for the DRAM cell scaling to 40 nm", *Technical Digest of International Electron Devices Meeting*, pp. 347-350, 2005.

SUMMARY OF THE INVENTION

An object of one embodiment of the present invention is to provide a memory device which sufficiently functions even when the capacitance of a capacitor is smaller than or equal to that in a conventional DRAM, specifically 1 fF or less, preferably 0.1 fF or less. Further, an object of one embodiment of the present invention is to provide a memory device in which a depth or a height necessary for a capacitor is 1 µm or less, preferably 0.3 µm or less.

Further, it is an object of one embodiment of the present invention to provide a memory device having a novel structure and a driving method thereof. In particular, it is an object of one embodiment of the present invention to provide a memory device in which power consumption can be reduced and a driving method in which power consumption can be reduced.

The present invention will be described below; terms used in this specification are briefly described. First, when one of a source and a drain of a transistor is called a drain, the other is called a source in this specification. That is, they are not distinguished depending on the potential level. Therefore, a portion called a source in this specification can be alternatively referred to as a drain.

Further, when the term "connect" is used in this specification, there is a case in which a corresponding physical connecting portion is not clear and a wiring is only extended in an actual circuit. For example, in the case of a circuit including an insulated-gate field-effect transistor (MISFET), one wiring functions as gates of a plurality of MISFETs in some cases. In that case, one wiring which branches into gates may be illustrated in a circuit diagram. Even in such a case, the expression "a wiring is connected to a gate" may be used in this specification.

Note that in this specification, in referring to a specific row, a specific column, or a specific position in a matrix, a reference sign is accompanied by a sign denoting coordinates as follows, for example: "a selection transistor STr_n_m", "a bit line MBL_m", and "a sub bit line SBL_n_m". In the case where a row, a column, or a position is not specified, the case where elements are collectively referred to, or the case where the position is obvious, the following expressions may be used: "a selection transistor STr", "a bit line MBL", and "a sub bit line SBL" or simply "a selection transistor", "a bit line", and "a sub bit line".

One embodiment of the present invention is a semiconductor memory device including a sense amplifier circuit formed over a substrate, a sub bit line formed over the sense amplifier circuit, an island-shaped semiconductor region formed over the sub bit line, a word line and a capacitor formed over the island-shaped semiconductor region, and a bit line covering the capacitor.

Another embodiment of the present invention is a semiconductor memory device including at least one bit line, four or more word lines, two or more memory blocks, and at least one sense amplifier circuit. The memory blocks each include two or more memory cells and a sub bit line. The memory cells each include at least one island-shaped semiconductor region and a capacitor. A first terminal of the sense amplifier circuit is connected to the sub bit line of a first memory block, and a second terminal of the sense amplifier circuit is connected to the sub bit line of a second memory block. The sub bit line of the first memory block and the sub bit line of the second memory block are below the word lines, and the bit line is above the word lines.

Here, a circuit (e.g., a decoder) for transmitting a signal to the bit line or word lines may be provided below the sub bit line, in addition to the sense amplifier circuit. The island-shaped semiconductor region may be provided at a recessed portion or a projected portion, other than on a flat surface. Adjacent sub bit lines may have different heights or depths.

The capacitance of the capacitor may be greater than or equal to 0.1 fF and less than or equal to 1 fF. The number of memory cells included in one memory block is preferably less than or equal to 64. Note that, in terms of preventing an error, the capacitance of the capacitor is preferably ten times or more as large as the capacitance of the sense amplifier circuit.

The off resistance of a cell transistor used in the above semiconductor memory device is preferably higher than or equal to $1\times10^{18}\Omega$, further preferably higher than or equal to $1\times10^{22}\Omega$. In order to obtain such high off resistance, a wide bandgap semiconductor such as an oxide semiconductor may be used as a semiconductor. Alternatively, the semiconductor region can be made as an ultrathin film having a thickness of 5 nm or less, preferably 1 nm or less.

In the above structure, the cell transistor is formed using the island-shaped semiconductor region and the word line. As described above, the sub bit line is located below the cell transistor, and the word line and the capacitor are located above the cell transistor. Therefore, the sub bit line can be arranged irrespective of the location of the capacitor, and thus, an extremely efficient layout can be obtained and the area of one memory cell can be ideally reduced to 6 $F^2$ (F is a feature size).

In addition, when the island-shaped semiconductor region is provided in a recessed portion, the word line is mainly formed at the side surface of the recessed portion, but a contact plug to the sub bit line may be provided in a contact hole formed in a bottom surface of the recessed portion, and the area of one memory cell can be ideally reduced to 4 $F^2$. The same applies to the case where the island-shaped semiconductor region is provided at a projected portion.

Note that in the case where the word line is provided at the side surface of the recessed portion or the projected portion, a channel length of the transistor whose gate is the word line is substantially equal to the height of the side surface or the depth of the recessed portion or the projected portion. Therefore, for example, when such a height or depth is appropriately determined, the integration degree is not reduced, the channel length can be larger than the feature size, and a short-channel effect can be suppressed.

In addition, in the above structure, the sub bit line is located in a position apart from the capacitor and the word line, and thus, a parasitic capacitance between the sub bit line and the capacitor or the word line can be reduced. When the parasitic capacitance of the sub bit line is reduced, the capacitance of the capacitor provided in a memory cell can be reduced in proportion thereto.

Particularly, in the above structure, a reduction in parasitic capacitance of the sub bit line brings about a more significant effect than a reduction in parasitic capacitance of the bit line. This is because the parasitic capacitance of the sub bit line also determines the capacitance of the capacitor, whereas the parasitic capacitance of the bit line relates only to signal delay in the above structure.

According to the above structure, the time needed for data reading is hardly changed even when the parasitic capacitance of the bit line is twice as large as that of a DRAM having a conventional structure. In the DRAM having a conventional structure, electric charge in a capacitor is released to a bit line and a change in the potential thereof is detected, in which case twice as much time, or more, as signal delay time is needed until the potential of the bit line is stabilized. A sense amplifier starts to operate after that; thus, several times as much time as the signal delay time is needed for data reading.

On the other hand, in the above structure, although electric charge in the capacitor is released to the sub bit line, the parasitic capacitance of the sub bit line is much smaller than that of the bit line in the DRAM having a conventional structure. In the DRAM having a conventional structure, one bit line is provided with about 2000 memory cells, and the parasitic capacitance of the bit line is about 200 fF.

In contrast, in the above structure, for example, in the case where one memory block includes 64 memory cells, the parasitic capacitance of the sub bit line is about 8 fF. Accordingly, the time until the sense amplifier starts to operate is about 4% of that of the DRAM having a conventional structure, and thus can be ignored.

The time needed for transferring a signal to the bit line from the sub bit line depends on the parasitic capacitance of the bit line. However, even when the parasitic capacitance of the bit line is twice as large as that of the DRAM having a conventional structure, data can already be transferred at the timing at which the sense amplifier starts to operate in the DRAM having a conventional structure.

Furthermore, a reduction in capacitance of the capacitor makes it unnecessary to form a structure body with a high aspect ratio, unlike in a conventional DRAM. Accordingly, the bit line can be easily provided over the capacitor.

Note that in the above structure, since the sub bit line is located below the cell transistor and there is no structure that becomes an obstruction, the depth at which the sub bit line is provided can be arbitrarily determined. Needless to say, the formation of the sub bit line in a position apart from another wiring makes it possible to further reduce the parasitic capacitance. In addition, when the depths of the sub bit lines adjacent to each other are different from each other, a parasitic capacitance between the adjacent sub bit lines can also be reduced.

Further, when a circuit (driver circuit) for driving the word line, the bit line, the sub bit line, and the like is provided below the sub bit line, the area of a chip can be reduced. In general, a driver circuit, including a sense amplifier, occupies 20% to 50% of the area of the surface of a conventional DRAM chip. When the driver circuit and a circuit provided with memory cells (memory cell array) are provided to overlap with each other, the area of the chip can be reduced, and a larger number of memory cells can be formed than in the case of a conventional DRAM chip having the same area.

DETAILED DESCRIPTION OF THE INVENTION

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In addition, ordinal numbers such as "first" and "second" are used to avoid confusion among components and do not necessarily mean the order. For example, another interlayer insulator may be provided below a first interlayer insulator, or another contact plug may be provided between a first contact plug and a second contact plug.

Embodiment 1

Figure 4A:
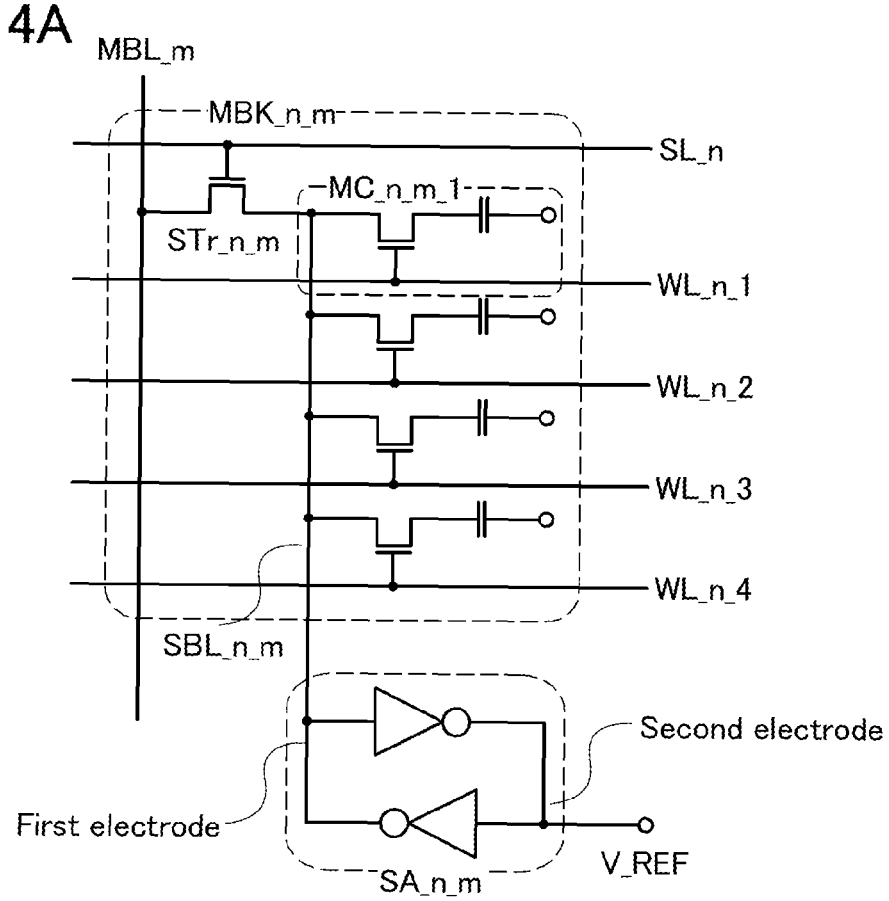
FIGS. 4A and 4B illustrate an example of a circuit applied to a semiconductor memory device of the present invention.

FIGS. 4A and 4B, FIG. 5, and FIG. 6 illustrate examples of a DRAM circuit to which this embodiment is applied. FIG. 4A illustrates an arrangement of one memory block and a sense amplifier circuit related thereto. As illustrated in FIG. 4A, a memory block MBK_n_m in an n-th row and an m-th column includes a selection transistor STr_n_m, a sub bit line SBL_n_m, and a plurality of (four in FIG. 4A) memory cells MC_n_m_1 to MC_n_m_4.

Although four memory cells MC are provided in the memory block MBK in FIG. 4A, a larger number of memory cells may be provided. For example, the number of the memory cells MC included in one memory block MBK is preferably 2 to 64. As the number of the memory cells increases, the length of the sub bit line SBL increases, and accordingly parasitic capacitance increases. When the capacitance of the capacitor of the memory cell MC is constant, a ratio of the capacitance of the capacitor of the memory cell MC to parasitic capacitance of the sub bit line SBL decreases; thus, a malfunction easily occurs when a signal is amplified by a sense amplifier circuit SA.

A gate, a source, and a drain of the selection transistor STr_n_m are respectively connected to a selection line SL_n, a bit line MBL_m, and the sub bit line SBL_n_m. Each memory cell includes one cell transistor and one capacitor. Gates, drains, and sources of the cell transistors are respectively connected to respective word lines WL_n_1 to WL_n_4, the sub bit line SBL_n_m, and respective one electrodes of the capacitors. Note that each memory cell may include two or more cell transistors or two or more capacitors.

A sense amplifier circuit SA_n_m can be constituted, for example, by a flip-flop circuit in which two inverters are combined, but is not limited to this structure. A first electrode of the sense amplifier circuit SA_n_m is connected to the sub bit line SBL_n_m, and a second electrode of the sense amplifier circuit SA_n_m is kept at a reference potential V_REF. The potential of another sub bit line or the like can be used as the reference potential V_REF; this will be described later.

Figure 4B:
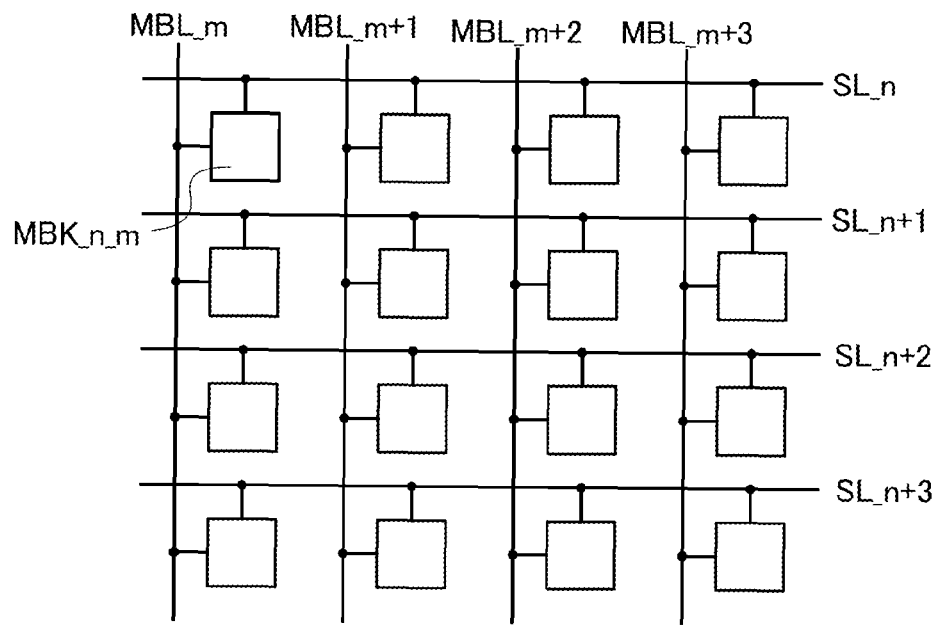

Such memory blocks MBK are arranged in a matrix as illustrated in FIG. 4B. Note that word lines are not shown in FIG. 4B.

Any of a variety of semiconductors can be used for the selection transistor STr, the cell transistor included in the memory cell MC, and a transistor used for the sense amplifier circuit SA. For example, all those transistors can be formed using the same semiconductor material. Alternatively, for example, the selection transistor STr and the transistor used for the sense amplifier circuit SA may be manufactured using a single crystal silicon semiconductor substrate, and the transistor included in the memory cell MC may be formed using a semiconductor layer in a thin film shape. In that case, for the semiconductor layer in a thin film shape, single crystalline silicon, polycrystalline silicon, or a semiconductor other than silicon, examples of which are an oxide semiconductor, a nitride semiconductor, and a sulfide semiconductor, may be used.

Particularly in the case of an oxide semiconductor having a band gap of three electron volts or more, by making the concentration of donors or acceptors $1\times10^{12}$ $cm^{-3}$ or lower, the resistance in an off state can be extremely high. In other words, by optimizing the potential of a gate, the resistance between a source and a drain in an off state (off resistance) can be $1\times10^{24}\Omega$ or higher.

For example, assuming that the off resistance of the cell transistor is $1\times10^{24}\Omega$, even when the capacitance of the capacitor of the memory cell is $1\times10^{-16}$ F, which is less than or equal to one hundredth of that of a conventional DRAM, a time constant is $1\times10^{8}$ seconds (about three years). Thus, data can be held for a long period, which cannot be assumed in a conventional DRAM. In other words, refreshing (rewriting of data for the purpose of compensating a reduction in electric charge accumulated in a capacitor) which needs to be performed ten times per second or more in a conventional DRAM becomes unnecessary in a usual usage.

At the time of data writing in a DRAM, much of current flowing in a bit line is used for charging and discharging of parasitic capacitance between the bit lines in addition to for charging of a capacitor of a memory cell. Since parasitic capacitance between the bit lines increases as the wiring width decreases, in the present situation of higher integration, current ten times or more as much as current for charging of the capacitor of the memory cell is used for charging and discharging of the parasitic capacitance between the bit lines.

Needless to say, charging and discharging of parasitic capacitance between the bit lines is a phenomenon not related to data holding, and performing refreshing leads to an increase in power consumption. In view of that, a reduction in the number of times of refreshing or omission of refreshing is effective in suppressing power consumption.

The operation of the semiconductor memory device in FIG. 4A will be described. First, writing operation will be described. For example, a case is considered where data is written to and read from the second memory cell MC_n_m_2 of the memory block in the n-th row and the m-th column. Here, the potential of the bit line MBL_m is set to 0 V or +1 V depending on data. Note that the writing potential can be determined as appropriate.

Supply of a potential to a word line or a selection line to turn on a transistor connected thereto is expressed as to "set the potential (of the word line or the selection line) to H", and supply of a potential to the word line or the selection line to turn off the transistor connected thereto is expressed as to "set the potential (of the word line or the selection line) to L".

The reference potential V_REF of the sense amplifier circuit SA_n_m is +0.5 V. The sense amplifier circuit SA_n_m outputs +1 V when the potential of the sub bit line SBL_n_m, which is to be amplified, is higher than the reference potential V_REF, and outputs 0 V when the potential of the sub bit line SBL_n_m is lower than the reference potential V_REF.

First, writing operation will be described. The potentials of the selection line SL_n and the word line WL_n_2 are set to H, so that the selection transistor STr_n_m and the cell transistor of the memory cell MC_n_m_2 are turned on. In addition, the potential of the bit line MBL_m is set to a potential corresponding to data to be written. As a result, the capacitor of the memory cell MC_n_m_2 is charged to the potential of the bit line MBL_m.

After charging is completed, the potentials of the selection line SL_n and the word line WL_n_2 are set to L, so that the selection transistor STr_n_m and the cell transistor of the memory cell MC_n_m_2 are turned off. Thus, data writing is completed.

Next, reading from the memory cell MC_n_m_2 will be described. Here, the capacitance of the capacitor of the memory cell MC_n_m_2 is one fourth of the sum of the parasitic capacitance of the sub bit line SBL_n_m and the capacitance of the sense amplifier circuit SA_n_m (including the gate capacitance and parasitic capacitance). Note that in manufacturing the memory device of this embodiment, the capacitance of the capacitor of the memory cell MC is preferably 10% or more of the sum of the parasitic capacitance of the sub bit line SBL and the capacitance of the sense amplifier circuit SA (including the gate capacitance and parasitic capacitance).

It is to be noted that the gate capacitance of the cell transistor cannot be ignored when the capacitance of the capacitor is small; however, the gate capacitance can be removed from the circuit by turning off the cell transistor when not needed. In this case, however, operation for turning off the cell transistor is required at least twice, and power consumption increases correspondingly.

First, the potential of the bit line MBL_m is set to +0.5 V, and the potential of the selection line SL_n is set to H, so that the selection transistor STr_n_m is turned on. As a result, the potential of the sub bit line SBL_n_m is +0.5 V.

Next, the potential of the selection line SL_n is set to L, so that the selection transistor STr_n_m is turned off. After that, the potential of the word line WL_n_2 is set to H, so that the cell transistor of the memory cell MC_n_m_2 is turned on. As a result, the potential of the sub bit line SBL_n_m changes. Since the selection transistor STr_n_m is off, only the capacitance of the capacitor of the memory cell MC_n_m_2, the parasitic capacitance of the sub bit line SBL_n_m, and the capacitance of the sense amplifier circuit SA_n_m may be considered here as for potential change.

Since the capacitance of the capacitor of the memory cell MC_n_m_2 is one fourth of the sum of the parasitic capacitance of the sub bit line SBL_n_m and the capacitance of the sense amplifier circuit SA_n_m as described above, the potential of the sub bit line SBL_n_m is either +0.4 V or +0.6 V.

After that, the sense amplifier circuit SA_n_m is operated to amplify the difference between the potential of the sub bit line SBL_n_m and the reference potential V_REF. That is, the potential of the sub bit line SBL_n_m becomes 0 V when the original potential is +0.4 V which is lower than the reference potential V_REF, and becomes +1 V when the original potential is +0.6 V which is higher than the reference potential V_REF.

Since the cell transistor of the memory cell MC_n_m_2 is on, the capacitor is automatically charged to the potential of the sub bit line SBL_n_m, which is equal to the potential at the time of writing. After charging of the capacitor, the potential of the word line WL_n_2 may be set to L to turn off the cell transistor of the memory cell MC_n_m_2.

In addition, the potential of the selection line SL_n is set to H, so that the selection transistor STr_n_m is turned on; thus, the potential of the bit line MBL_m becomes equal to the potential of the sub bit line SBL_n_m. Data can be read out by reading this potential of the bit line MBL_m.

Figure 5:
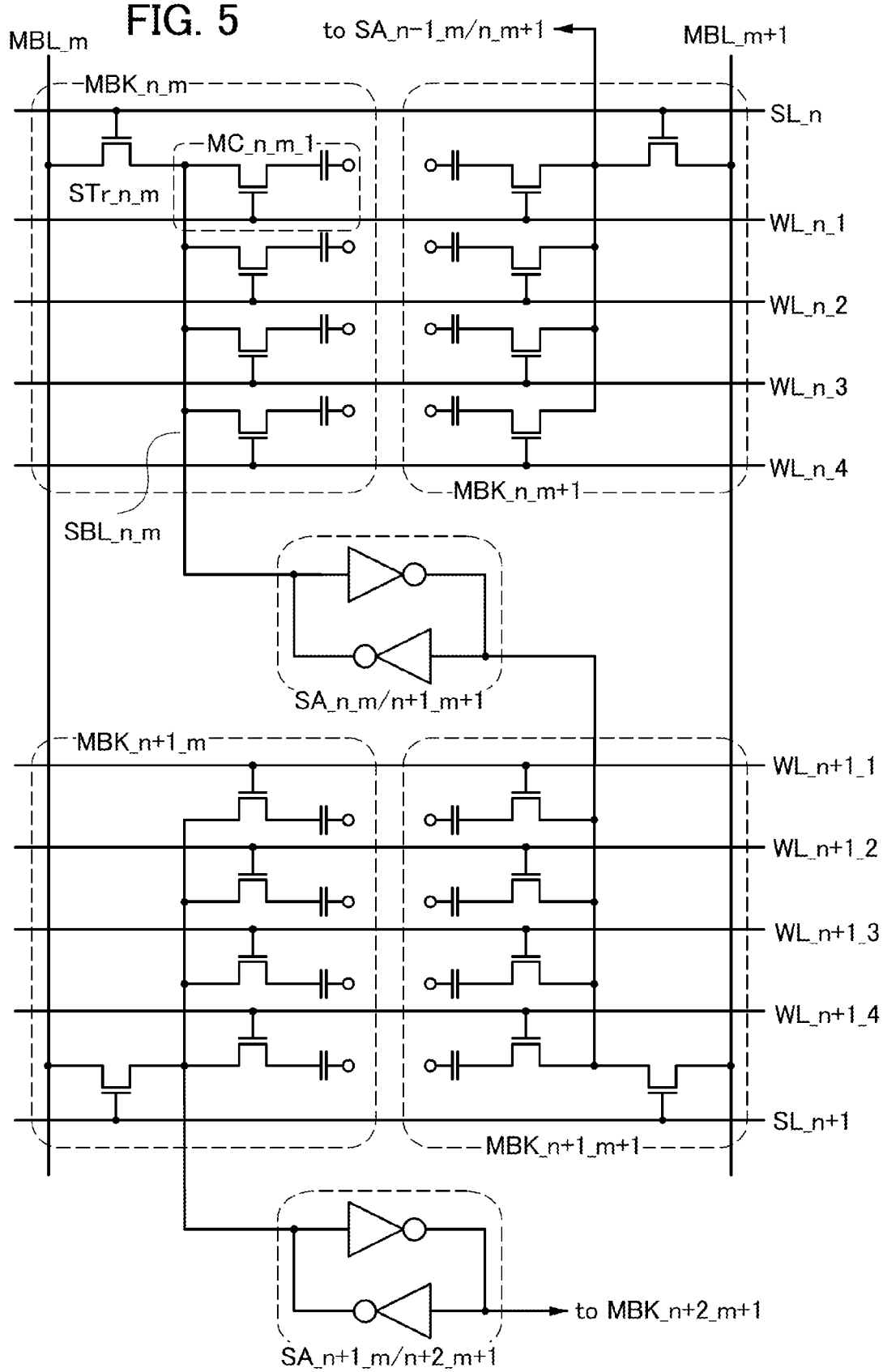
FIG. 5 illustrates an example of a circuit applied to a semiconductor memory device of the present invention.

The potential of another sub bit line can be used as the reference potential V_REF. For example, FIG. 5 illustrates an open bit line type DRAM to which one of the technical ideas of the present invention is applied, where the potential of a sub bit line SBL_n+1_m+1 of a memory block MBK_n+1_m+1 in an (n+1)-th row and an (m+1)-th column is used as a reference potential.

Needless to say, the potential of the sub bit line SBL_n_m is used as a reference potential of the sub bit line SBL_n+1_m+1 in some cases, because a first electrode and a second electrode (i.e., a pair of input and output terminals) of a flip-flop type sense amplifier circuit are equivalent to each other. In other words, as in this example, the flip-flop type sense amplifier circuit is used for amplifying the potential difference between the sub bit line SBL_n_m and the sub bit line SBL_n+1_m+1. According to such a feature, the sense amplifier circuit is expressed here as a sense amplifier circuit SA_n_m/n+1_m+1.

Similarly, a sense amplifier circuit SA_n+1_m/n+2_m+1 is provided for amplifying the potential difference between a sub bit line SBL_n+1_m of a memory block MBK_n+1_m in the (n+1)-th row and the m-th column and a sub bit line SBL_n+2_m+1 of a memory block MBK_n+2_m+1 in an (n+2)-th row and the (m+1)-th column. Further, the potential of a sub bit line SBL_n_m+1 of a memory block MBK_n_m+1 in the n-th row and the (m+1)-th column is compared with the potential of a sub bit line SBL_n−1_m of a memory block MBK_n−1_m in an (n−1)-th row and the m-th column and amplified by a sense amplifier circuit SA_n−1_m/n_m+1.

The operation of the circuit in FIG. 5 will be described. Description of writing operation will be omitted because it is the same as the case of FIG. 4A, and reading operation will be described below. For example, the case where data is read from the memory cell MC_n_m_2 is described.

First, the potentials of the bit lines MBL_m and MBL_m+1 are set to +0.5 V. Further, the potentials of the selection lines SL_n and SL_n+1 are set to H, so that the selection transistors STr_n_m and STr_n+1_m+1 are turned on. Then, the potentials of the selection lines SL_n and SL_n+1 are set to L, so that the selection transistors STr_n_m and STr_n+1_m+1 are turned off. As a result, the potentials of the sub bit lines SBL_n_m and SBL_n+1_m+1 are +0.5 V.

Next, the potential of the word line WL_n_2 is set to H, so that the cell transistor of the memory cell MC_n_m_2 is turned on. As a result, the potential of the sub bit line SBL_n_m is either +0.4 V or +0.6 V. On the other hand, since there is no cell transistor turned on in the memory cells connected to the sub bit line SBL_n+1_m+1, the potential of the sub bit line SBL_n+1_m+1 remains at +0.5 V.

After that, the sense amplifier circuit SA_n_m/n+1_m+1 is operated to amplify the potential of the sub bit line SBL_n_m. That is, the potential of the sub bit line SBL_n_m becomes 0 V when the original potential is +0.4 V which is lower than the potential of the sub bit line SBL_n+1_m+1 (+0.5 V), and becomes +1 V when the original potential is +0.6 V which is higher than the potential of the sub bit line SBL_n+1_m+1.

Then, the potential of the selection line SL_n is set to H, so that the selection transistor STr_n_m is turned on; thus, the potential of the bit line MBL_m becomes equal to the potential of the sub bit line SBL_n_m. Data can be read out by reading this potential of the bit line MBL_m.

In the above process, the cell transistors of the other memory cells (e.g., a memory cell MC_n_m+1_2) connected to the word line WL_n_2 are also turned on to release electric charge accumulated in the capacitors; thus, in order to restore the electric charge, for example, the sense amplifier circuit SA_n−1_m/n_m+1 also needs to be operated similarly.

Figure 6:
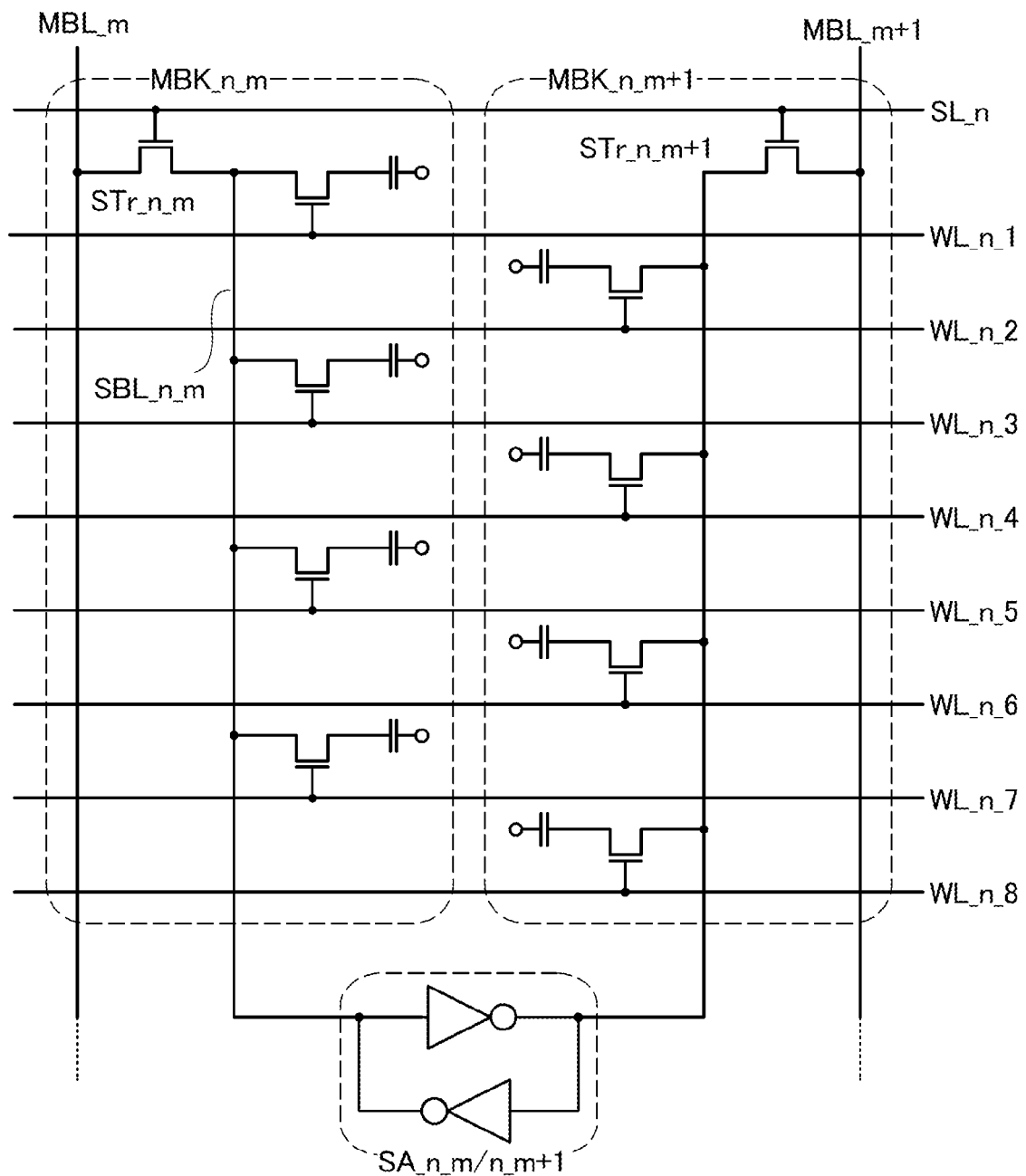
FIG. 6 illustrates an example of a circuit applied to a semiconductor memory device of the present invention.

FIG. 6 illustrates a folded bit line type DRAM to which one of the technical ideas of the present invention is applied, where a sense amplifier circuit SA_n_m/n_m+1 amplifies the potential difference between a sub bit line SBL_n_m of a memory block MBK_n_m in an n-th row and an m-th column and a sub bit line SBL_n_m+1 of a memory block MBK_n_m+1 in the n-th row and an (m+1)-th column.

Note that in a folded bit line type DRAM, memory cells are provided at only half of intersections of word lines and sub bit lines. Therefore, the degree of integration is lower than that of an open bit line type DRAM.

The operation of the circuit of FIG. 6 is described. Description of writing operation will be omitted because it is the same as the case of FIG. 4A, and reading operation will be described below. For example, the case where data is read from the memory cell MC_n_m_3 is described.

First, the potentials of the bit lines MBL_m and MBL_m+1 are set to +0.5 V. Further, the potential of the selection line SL_n is set to H, so that the selection transistors STr_n_m and STr_n_m+1 are turned on. Then, the potential of the selection line SL_n is set to L, so that the selection transistors STr_n_m and STr_n_m+1 are turned off. As a result, the potentials of the sub bit lines SBL_n_m and SBL_n_m+1 are +0.5 V.

Next, the potential of the word line WL_n_3 is set to H, so that the cell transistor of the memory cell MC_n_m_3 is turned on. As a result, the potential of the sub bit line SBL_n_m is either +0.4 V or +0.6 V. On the other hand, since there is no cell transistor turned on in the memory cells connected to the sub bit line SBL_n_m+1, the potential of the sub bit line SBL_n+1_m+1 remains at +0.5 V.

After that, the sense amplifier circuit SA_n_m/n_m+1 is operated to amplify the potential of the sub bit line SBL_n_m. Then, the potential of the selection line SL_n is set to H, so that the selection transistors STr_n_m and STr_n_m+1 are turned on: thus, the potential of the bit line MBL_m becomes equal to the potential of the sub bit line SBL_n_m. Data can be read out by reading this potential of the bit line MBL_m.

Figure 7A:
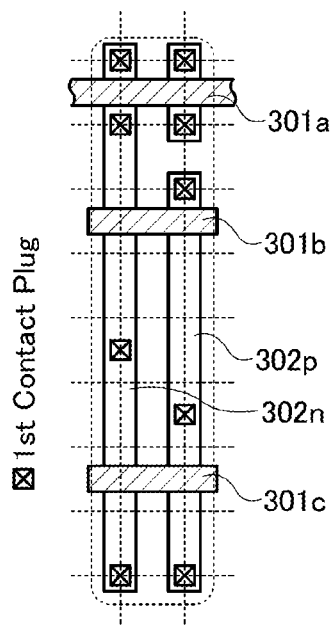
FIGS. 7A to 7F illustrate examples of a method for manufacturing a semiconductor memory device of the present invention.
Figure 7B:
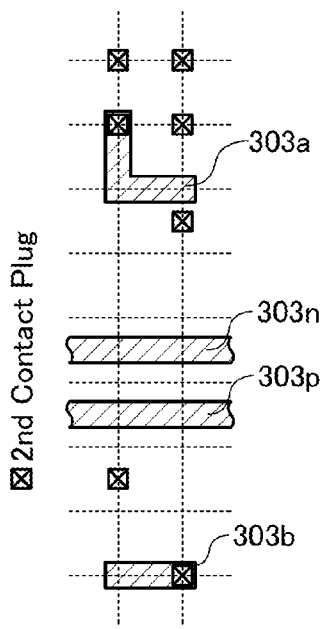
Figure 7C:
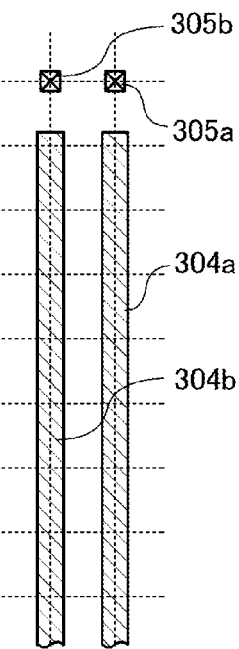

FIGS. 7A to 7F illustrate examples of a circuit layout of the sense amplifier circuit SA and the selection transistor STr, which can be applied to FIG. 5 or FIG. 6. FIGS. 7A to 7C illustrate a layout of a wiring and the like of a sense amplifier which can be used for a folded bit line type DRAM circuit in FIG. 6, and FIGS. 7D to 7F illustrate a layout of a wiring and the like which can be used for an open bit line type circuit in FIG. 5. For details, known manufacturing techniques of semiconductor integrated circuits can be referred to.

FIG. 7A illustrates examples of element formation regions formed using a semiconductor substrate or the like and first wirings and the like provided thereover. An element formation region 302n and an element formation region 302p are formed, and first wirings 301a to 301c are formed to overlap therewith. The first wirings 301a to 301c each function as a gate of a transistor. For example, the first wiring 301a functions as the selection line SL. The first wirings 301b and 301c serve as gates of the inverters in the sense amplifier circuit SA.

An n-type or p-type impurity can be added by doping in a self-aligned manner using the first wirings 301a to 301c. Here, an n-channel transistor and a p-channel transistor are formed in the element formation region 302n and the element formation region 302p, respectively. Further, as illustrated in the drawing, first contact plugs used for connection to an upper layer are provided in the element formation region 302n and the element formation region 302p.

FIG. 7B illustrates a layout of second wirings 303a, 303b, 303n, and 303p which are formed over the circuit illustrated in FIG. 7A, and second contact plugs for connection to an upper layer. The second wirings 303a and 303b are each provided for connection between a drain of the n-channel transistor and a drain of the p-channel transistor, and the second wirings 303n and 303p are connected to sources of the n-channel transistor and the p-channel transistor to supply power to the sense amplifier.

Further, the second contact plugs are provided for connection between the first wiring 301b and the upper layer, between the first wiring 301c and the upper layer, between the second wiring 303a and the upper layer, and between the second wiring 303b and the upper layer.

FIG. 7C illustrates a layout of third wirings 304a and 304b which are formed over the circuit illustrated in FIG. 7B, and third contact plugs for connection to an upper layer. The third wirings 304a and 304b are sub bit lines. Third contact plugs 305a and 305b are provided to be connected to a bit line in an upper layer. In the upper layer, the bit line is preferably provided in parallel to the sub bit lines; however, deviation of 45° or less is acceptable.

The third wiring 304a connects a gate of an inverter formed in an upper portion of the drawing and an output of an inverter formed in a lower portion of the drawing, and the third wiring 304b connects a gate of the inverter formed in the lower portion of the drawing and an output of the inverter formed in the upper portion of the drawing.

Figure 7D:
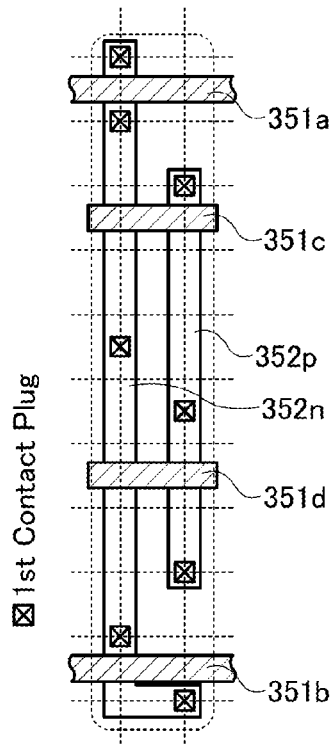

FIG. 7D illustrates examples of element formation regions formed using a semiconductor substrate or the like and first wirings and the like provided thereover. An element formation region 352n and an element formation region 352p are formed, and first wirings 351a to 351d are formed to overlap therewith. For example, the first wiring 351a functions as the selection line SL_n, and the first wiring 351b functions as the selection line SL_n+1 in the next row.

Here, an n-channel transistor and a p-channel transistor are formed in the element formation region 352n and the element formation region 352p, respectively. Further, as illustrated in the drawing, first contact plugs used for connection to an upper layer are provided in the element formation region 352n and the element formation region 352p.

Figure 7E:
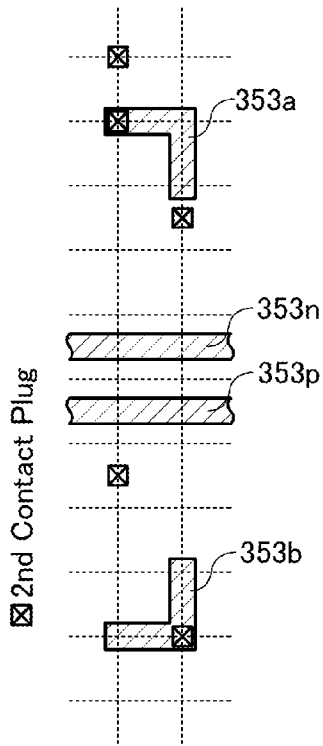

FIG. 7E illustrates a layout of second wirings 353a, 353b, 353n, and 353p which are formed over the circuit illustrated in FIG. 7D, and second contact plugs for connection to an upper layer. The second wirings 353a and 353b are each provided for connection between a drain of the n-channel transistor and a drain of the p-channel transistor, and the second wirings 353n and 353p are connected to sources of the n-channel transistor and the p-channel transistor to supply power to the sense amplifier.

Further, the second contact plugs are provided for connection between the first wiring 351c and the upper layer, between the first wiring 351d and the upper layer, between the second wiring 353a and the upper layer, and between the second wiring 353b and the upper layer.

Figure 7F:
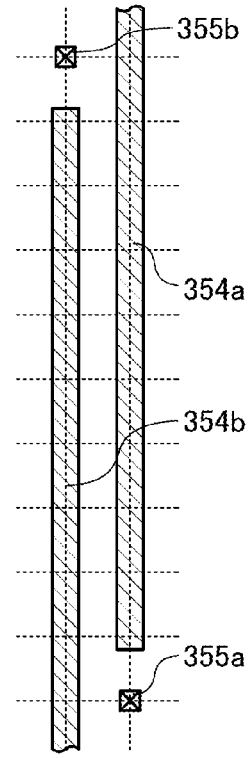

FIG. 7F illustrates a layout of third wirings 354a and 354b which are formed over the circuit illustrated in FIG. 7E, and third contact plugs for connection to an upper layer. The third wirings 354a and 354b are sub bit lines. Third contact plugs 355a and 355b are provided to be connected to a bit line in an upper layer.

The third wiring 354a connects a gate of an inverter formed in an upper portion of the drawing and an output of an inverter formed in a lower portion of the drawing, and the third wiring 354b connects a gate of the inverter formed in the lower portion of the drawing and an output of the inverter formed in the upper portion of the drawing.

In the semiconductor memory device of this embodiment, the memory cell is formed over the circuit including the sense amplifier and the like described above. A manufacturing process thereof is described with reference to FIGS. 1A and 1B, FIG. 2, and FIG. 3. FIGS. 1A and 1B, FIG. 2, and FIG. 3 each illustrate one cross section parallel to the sub bit line of the semiconductor memory device.

<FIG. 1A>

A semiconductor circuit 102 including a transistor is formed on a substrate 101 as described above. A first insulator 103 having an appropriate thickness and first contact plugs 104 are formed. A substrate having a single crystal semiconductor on its surface (e.g., a single crystal semiconductor substrate or an SOI substrate) is preferably used as the substrate 101. As the single crystal semiconductor, single crystal silicon, single crystal germanium, single crystal silicon germanium, single crystal gallium arsenide, single crystal indium phosphide, single crystal indium arsenide, or the like can be used.

After that, sub bit lines 105a and 105c and a connection electrode 105b are formed in contact with the first contact plugs. Further, a second insulator 106 having an appropriate thickness and second contact plugs 107 connected to the sub bit lines 105a and 105c and the connection electrode 105b are formed thereover. The thickness of the first insulator 103 and the thickness of the second insulator 106 are important when the parasitic capacitance of the sub bit line is determined. The first insulator 103 and the second insulator 106 each preferably have a thickness of 100 nm to 1 μm. Further, the first insulator 103 and the second insulator 106 are each preferably formed using a material having a relatively low dielectric constant such as silicon oxide.

<FIG. 1B>

Island-shaped semiconductor regions 108a and 108b are formed and a gate insulator 109 is formed to cover the semiconductor regions 108a and 108b. The thicknesses of the semiconductor regions 108a and 108b and the gate insulator 109 can be determined appropriately, but are each preferably small when a channel length of the transistor is small, and are preferably one fiftieth to one fifth of the channel length, for example. Note that the gate insulator 109 may be thinned to such a level that a tunneling current or the like does not cause a problem. In addition, the gate insulator 109 may be formed using a material having a dielectric constant of 10 or more.

There is no limitation on the kind of a semiconductor used for the semiconductor regions 108a and 108b but the mobility thereof is preferably higher than or equal to 5 $cm^2/Vs$. For example, polycrystalline silicon, polycrystalline germanium, polycrystalline silicon germanium, indium oxide, an oxide obtained by adding a metal element to indium oxide, gallium nitride, a compound obtained by adding oxygen to gallium nitride, gallium arsenide, indium arsenide, zinc sulfide, or the like may be used.

Although the semiconductor regions 108a and 108b constitute respective parts of cell transistors, the field-effect mobility of the semiconductor does not matter so much. A material of the semiconductor regions 108a and 108b may be selected and the channel length and channel width may be determined so that the product of the on resistance of a cell transistor and the capacitance of a capacitor in each memory cell is 1 nsec or less. For example, when the capacitance of the capacitor is 1 fF, the on resistance of the cell transistor may be set to 1 MΩ or less.

In the semiconductor memory device of this embodiment, the off resistance is more important than the on resistance. The off resistance of the cell transistor is determined relative to the capacitance of the capacitor of the memory cell. When the refresh interval is substantially equal to that of a conventional DRAM and the capacitance of the capacitor of the memory cell is one tenth of that of a conventional DRAM, the off resistance of the cell transistor needs to be ten times as large as that of a cell transistor of a conventional DRAM.

It is preferable to further increase the off resistance of the cell transistor because the refresh interval of the memory cell can be further lengthened. For example, when the off resistance is one million times that of a conventional cell transistor, the cell transistor can be used practically without refresh operation.

In order to obtain such a very high off resistance, it is preferable to use a wide band gap semiconductor whose band gap is greater than or equal to 2.5 eV and less than or equal to 4 eV, preferably greater than or equal to 3 eV and less than or equal to 3.8 eV. For example, an oxide semiconductor such as indium oxide or zinc oxide, a nitride semiconductor such as gallium nitride, a sulfide semiconductor such as zinc sulfide, or the like may be used.

The off resistance is inversely proportional to the concentration of thermally excited carriers. Even in the state where there is no carrier caused by a donor or an acceptor (an intrinsic semiconductor), since the band gap of silicon is 1.1 eV, the concentration of thermally excited carriers at room temperature (300 K) is approximately $1 \times 10^{11}$ $cm^{-3}$.

On the other hand, the concentration of thermally excited carriers of a semiconductor having a band gap of 3.2 eV is approximately $1 \times 10^{-7}$ $cm^{-3}$. When the semiconductor having a band gap of 3.2 eV and silicon have the same electron mobility, the resistivity of the semiconductor having a band gap of 3.2 eV is 18 orders of magnitude higher than that of the silicon because resistivity is inversely proportional to a carrier concentration.

Note that the concentration of carriers caused by donors and acceptors is preferably as low as possible, and is preferably $1 \times 10^{12}$ $cm^{-3}$ or lower. The threshold voltage of the transistor is determined by the carrier concentration.

Even when silicon is used, the off resistance of the cell transistor can be increased to about 100 times as large as that of a conventional cell transistor. In a transistor including silicon, the resistance between a source and a drain is determined by a p-n junction. In a p-n junction, a depletion layer becomes thinner as the impurity concentrations are increased, and thus tunneling current is generated, which impairs the insulating property of the depletion layer. Thus, the concentration of a donor or an accepter is preferably less than or equal to $1\times10^{14}$ cm$^{-3}$ at least at a portion where a channel is formed.

However, with such low concentration at the portion where a channel is formed, the insulating property is impaired by entry of carriers from the source. This problem can be solved by reducing the thickness of the semiconductor regions 108a and 108b to 5 nm or less, preferably 1 nm or less. Alternatively, the channel may be formed in a direction perpendicular to the substrate so that the substantial channel length is increased. These can be applied also to the case of using a wide bandgap semiconductor such as an oxide semiconductor.

In addition, it is preferable to form a film of a material with a work function of 5 eV or more (e.g., a platinum group element such as platinum or palladium, a nitride such as indium nitride or zinc nitride, or p-type silicon) on a surface of a word line formed later, which faces the semiconductor region with the gate insulator 109 positioned therebetween.

After the semiconductor regions 108a and 108b and the gate insulator 109 are formed, word lines 110a to 110d are formed. The word lines 110a to 110d each function as the gate of the cell transistor in the memory cell.

In general, when a semiconductor integrated circuit is provided in a lower layer, noise generated by the semiconductor integrated circuit interferes with the operation of a transistor in an upper layer in some cases. To solve the problem, it is desirable to provide a shield layer below the transistor in the upper layer, particularly below the sub bit lines 105a and 105c, so that the shield layer absorbs the noise.
<FIG. 2>

Impurities are injected to the semiconductor regions 108a and 108b by an ion injection method or the like using the word lines 110a to 110d as masks, so that n-type and p-type doped regions 111 are formed. Note that in the case where distances between portions where the second contact plugs 107 are in contact with the semiconductor regions 108a and 108b and the word lines 110a to 110d, or distances between portions where third contact plugs to be formed later are in contact with the semiconductor regions 108a and 108b and the word lines 110a to 110d are each less than or equal to 20 nm, preferably less than or equal to 10 nm, the doped regions 111 are not necessarily formed.

In addition, in the case where the semiconductor regions 108a and 108b each have any conductivity type in advance, the transistors can be controlled by using a difference in work function between the semiconductor regions and the material included in the word lines 110a to 110d, so that the doped regions 111 are not necessarily formed in some cases.

For example, even in the case where an impurity is not particularly added by doping in polycrystalline silicon on silicon oxide, the polycrystalline silicon exhibits n-type conductivity, and when a material having a work function of 5 eV or more, such as indium nitride, zinc nitride, or p-type silicon is used for the word lines 110a to 110d, electrons can be removed and thus a region having an extremely high resistivity can be formed.

Next, a third insulator 112 is formed using a material having a relatively low dielectric constant, such as silicon oxide, and third contact plugs 113 are formed. Further, a fourth insulator 114 is also formed using a material having low dielectric constant and holes for forming capacitors are provided therein. In this embodiment, since the capacitance of the capacitor of the memory cell can be reduced to one tenth or less of that of a conventional DRAM, the depth of the hole can also be reduced to one tenth or less of that of a conventional DRAM, that is, 0.3 µm or less, preferably 30 nm or less.

Formation of such a shallow hole is advantageous in forming an electrode and an insulator of a capacitor which are formed later inside the hole. This is because there is significant technical difficulty in forming them inside a deep hole whose aspect ratio exceeds 50 times, which results in a decrease in yield. Moreover, an insulator with higher dielectric constant and an electrode material with higher conductivity cannot be formed in some cases under such a condition. In contrast, when the aspect ratio is ten times or less, an electrode and an insulator can be relatively easily formed and more kinds of preferable materials can be used.

Then, first capacitor electrodes 115a to 115d each having a thickness of 2 nm to 20 nm are formed over inner surfaces of the holes. Note that the upper limit of the thickness of each of the first capacitor electrodes 115a to 115d may be determined in accordance with the feature size F. When F is 20 nm, the thickness is preferably less than or equal to 5 nm; when F is 10 nm, the thickness is preferably less than or equal to 2.5 nm.

Figure 1A:
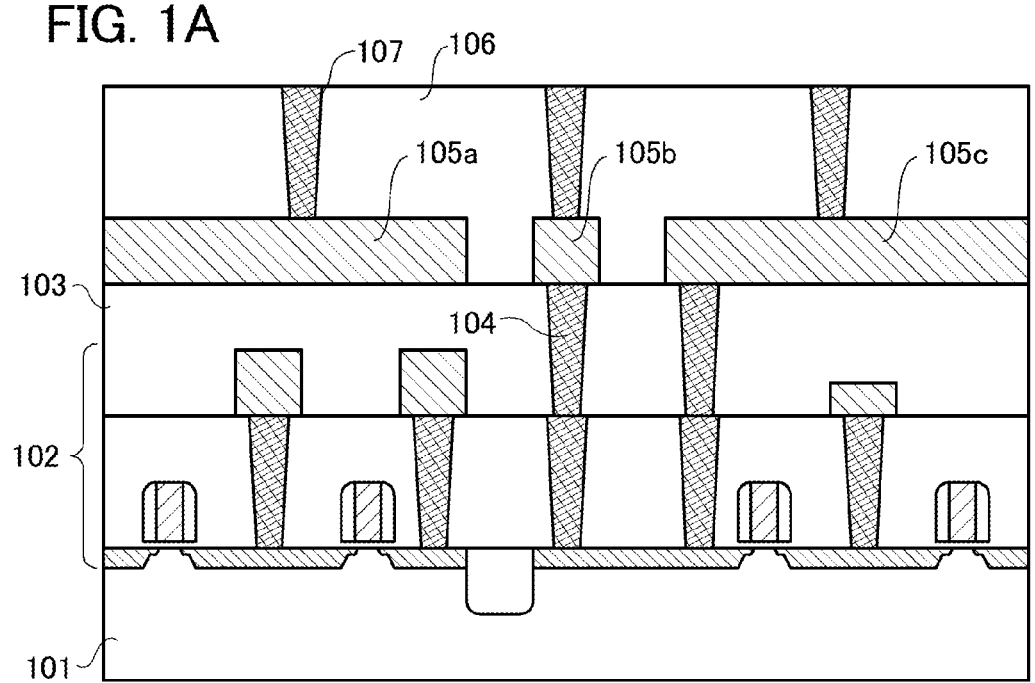
FIGS. 1A and 1B illustrate an example of a method for manufacturing a semiconductor memory device of the present invention.
Figure 1B:
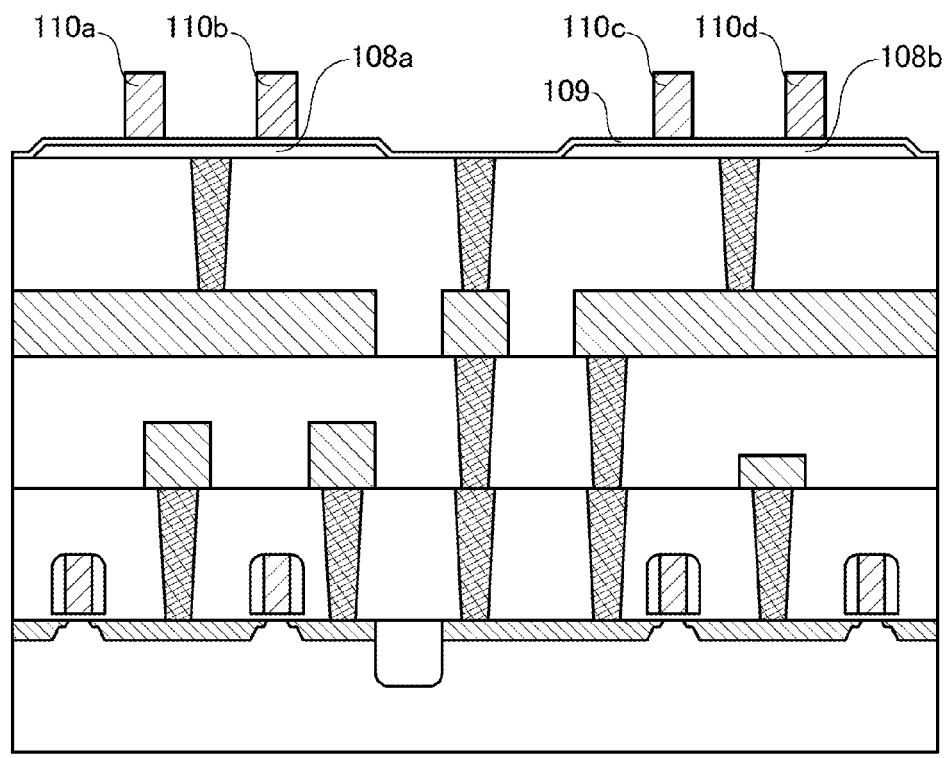
Figure 2:
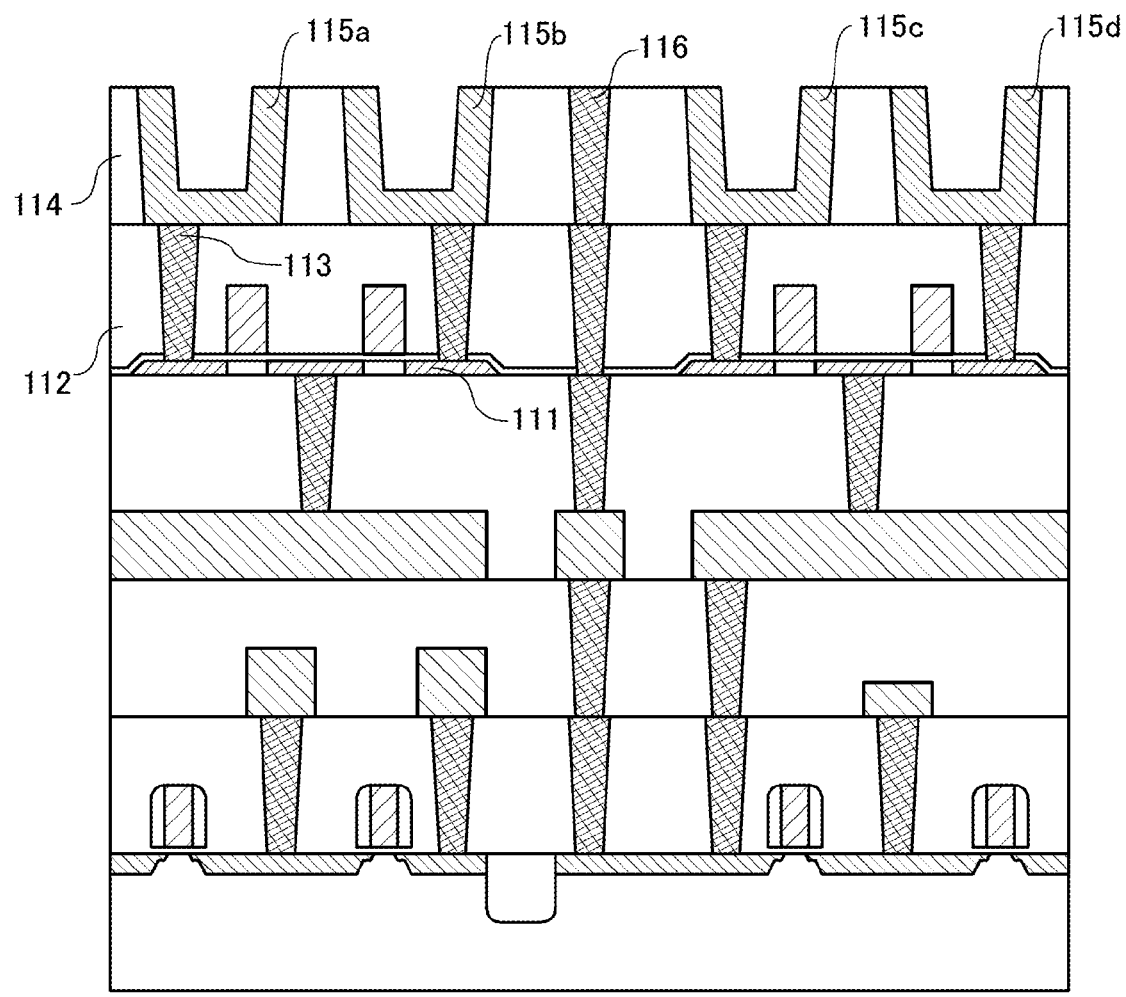
FIG. 2 illustrates an example of a method for manufacturing a semiconductor memory device of the present invention.
Figure 3:
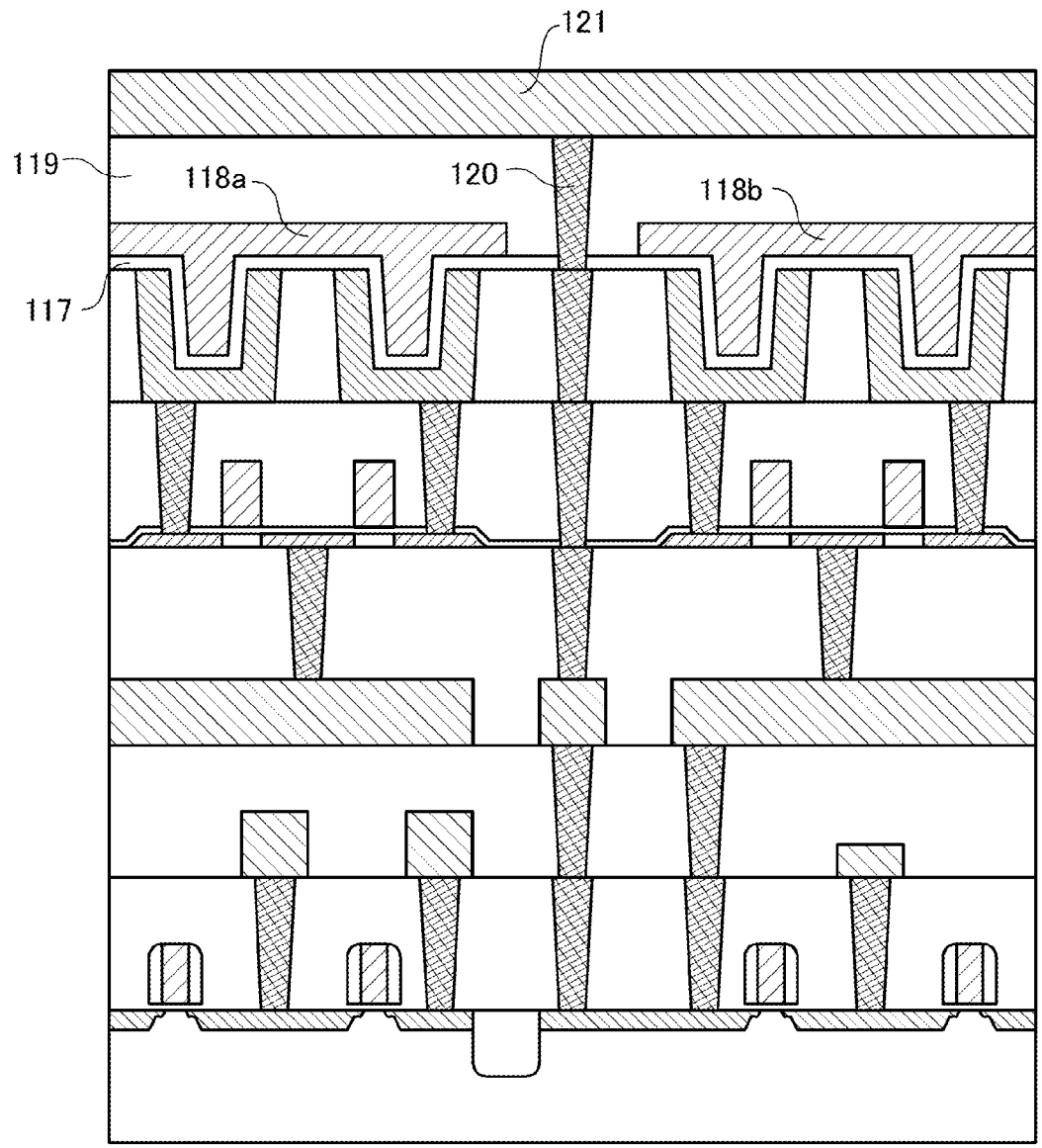
FIG. 3 illustrates an example of a method for manufacturing a semiconductor memory device of the present invention.

Further, a fourth contact plug 116 is formed.
<FIG. 3>

A capacitor insulator 117 with a thickness of 2 nm to 20 nm is formed. The capacitor insulator 117 can be formed using any of various high-k materials, preferably hafnium oxide, zirconium oxide, tantalum oxide, barium strontium titanate, or the like.

Further, second capacitor electrodes 118a and 118b are formed. Then, a fifth insulator 119 and a fifth contact plug 120 are formed, and a bit line 121 is formed in contact with the fifth contact plug 120.

Embodiment 2

FIGS. 8A to 8D and FIGS. 9A to 9D illustrate this embodiment. Although in this embodiment, a memory cell is formed over a semiconductor circuit including a sense amplifier as in Embodiment 1, such a semiconductor circuit is omitted in FIGS. 8A to 8D and FIGS. 9A to 9D. Description is made below with reference to the drawings.
<FIG. 8A>

Figure 8A:
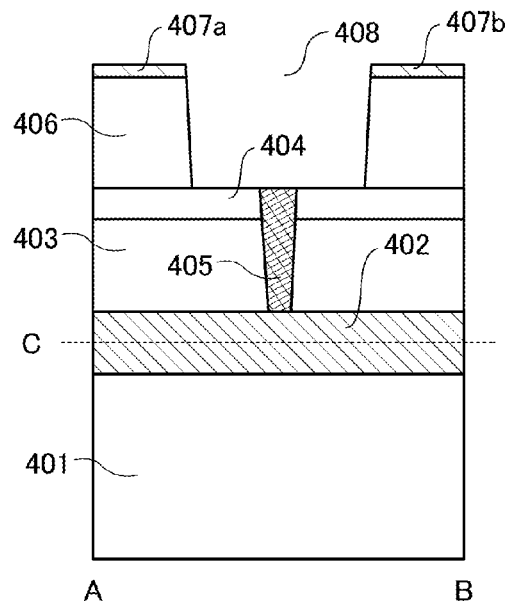
FIGS. 8A to 8D illustrate an example of a method for manufacturing a semiconductor memory device of the present invention.
Figure 8B:
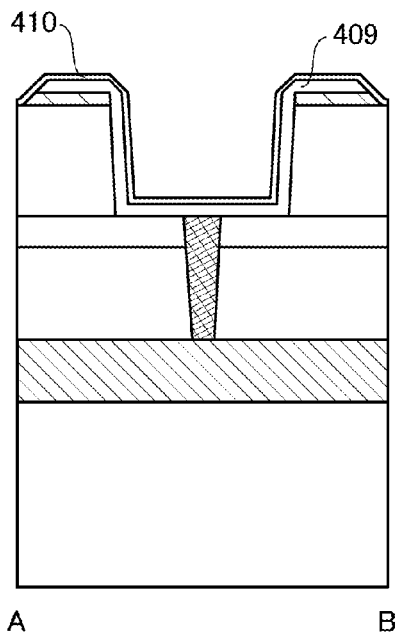
Figure 8C:
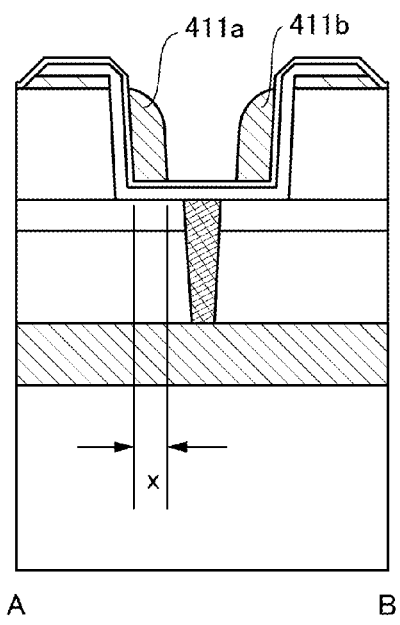
Figure 8D:
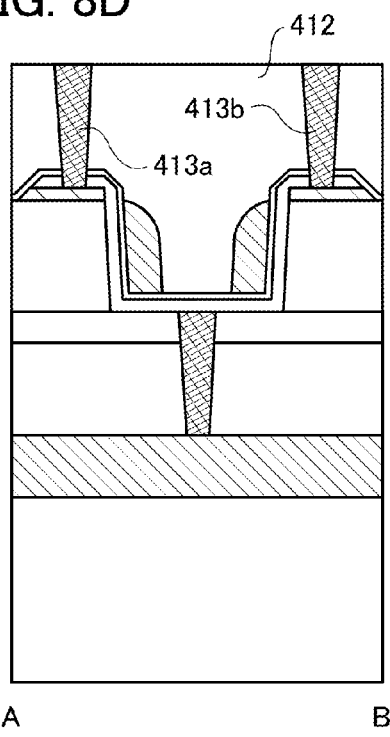
Figure 9A:
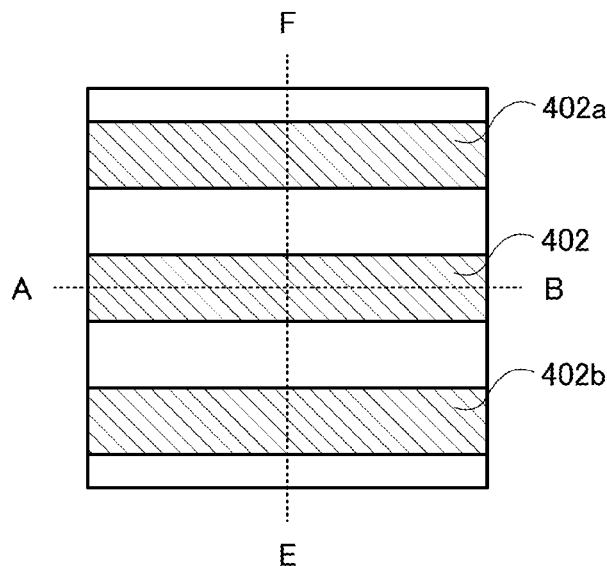
FIGS. 9A to 9D illustrate examples of a structure of a semiconductor memory device of the present invention.
Figure 9B:
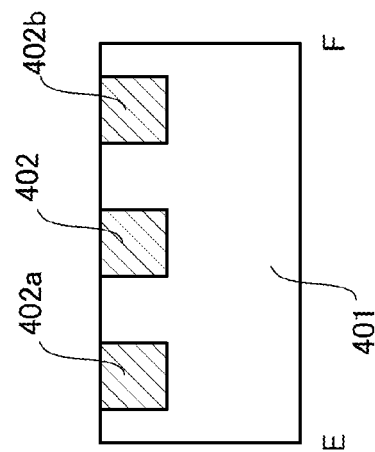

A sub bit line 402 is formed over a first insulator 401. At this time, there are some methods of arrangement of the sub bit line 402. For example, there is a method in which, as illustrated in FIGS. 9A and 9B, the sub bit line 402 and adjacent sub bit lines 402a and 402b are formed at the same depth or formed in the same layer. FIG. 9A is a schematic view of a cross section of a surface where the sub bit line 402 is formed, which is taken along a plane through line C-D of FIG. 8A, and FIG. 9B illustrates a cross section taken along line E-F of FIG. 9A. Note that cross sections along lines A-B of FIGS. 9A and 9C are illustrated in FIGS. 8A to 8D.

As illustrated in FIG. 9B, the sub bit lines 402a and 402b adjacent to the sub bit line 402 are formed at the same depth or in the same layer as the sub bit line 402. A feature of this arrangement is that the number of manufacturing steps is small.

Figure 9C:
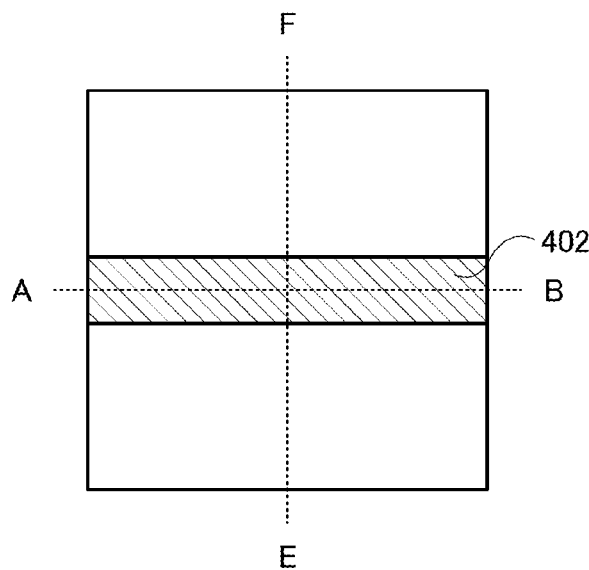
Figure 9D:
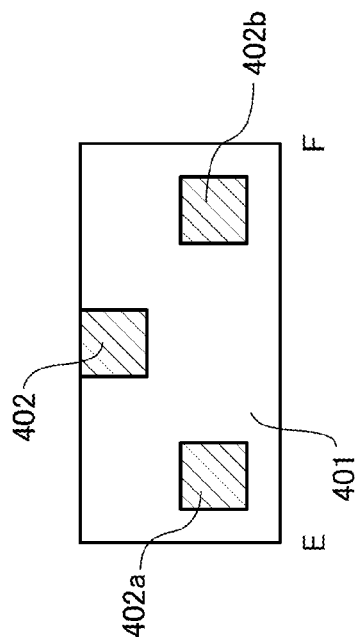

Another method is that the sub bit line 402 is formed at a different depth or in a different layer from that of the sub bit lines 402a and 402b adjacent to the sub bit line 402 as illustrated in FIGS. 9C and 9D. FIG. 9C is a schematic view of a cross section taken along a plane through line C-D of FIG. 8A, and FIG. 9D is a cross section taken along line E-F of FIG. 9C.

Although the sub bit lines 402a and 402b adjacent to the sub bit line 402 cannot be seen in FIG. 9C, the sub bit lines 402a and 402b adjacent to the sub bit line 402 are formed at a different depth from that of the sub bit line 402 as illustrated in FIG. 9D. An additional manufacturing step is needed in this method but a parasitic capacitance between sub bit lines adjacent to each other can be reduced as compared to the method in which the sub bit lines are formed in the same layer. Although the sub bit lines are formed at two different depths in FIG. 9D, the sub bit lines may be formed at three or more different depths.

In a conventional DRAM, arrangement of a sub bit line is strictly limited because a structure such as a capacitor is provided in a region where the sub bit line is arranged; in this embodiment, the capacitor is formed apart from the sub bit line, so that the sub bit line can be arranged relatively freely and the sub bit lines can be formed at different depths as described above. Any of the methods can be used in this embodiment.

As described above, in one embodiment of the present invention, it is more effective to reduce the parasitic capacitance of a sub bit line than to reduce the parasitic capacitance of a bit line in terms of reducing the capacitance of a capacitor of a memory cell. A reduction in parasitic capacitance of the sub bit line enables the size of a capacitor to be reduced; thus, an effect worth an increase in the number of steps can be obtained.

Next, a second insulator 403 and a third insulator 404 are formed. The second insulator 403 and the third insulator 404 are preferably formed using different kinds of materials or materials having different etching rates. For example, silicon oxide and silicon nitride can be used as the second insulator 403 and the third insulator 404, respectively. Then, a first contact plug 405 connected to the sub bit line 402 is embedded in the second insulator 403 and the third insulator 404.

Next, an insulator and a conductive layer are formed and etched into a grooved shape, so that a groove 408, and a fourth insulator 406 and conductive layers 407a and 407b which are separated by the groove 408 are formed. At this time, the etching is stopped at the third insulator. In other words, the third insulator serves as an etching stopper.

<FIG. 8B>

Next, a semiconductor film is formed over a bottom surface and at side surfaces of the groove 408, the semiconductor film and the conductive layers 407a and 407b are etched, and an island-shaped semiconductor region 409 is formed. In addition, a gate insulator 410 is formed over the semiconductor region 409.

<FIG. 8C>

After that, a film of a conductive material is formed and subjected to anisotropic etching, whereby word lines 411a and 411b which are in contact with part of the gate insulator 410 at the side surfaces of the groove 408 are formed. Patent Document 1 may be referred to for a method such that the word lines 411a and 411b are formed at the side surfaces of the groove. As disclosed in Patent Document 1, an impurity may be added to the semiconductor region 409 using the word lines 411a and 411b as masks.

The transistors including the word lines 411a and 411b can each have a channel length larger than the feature size. In other words, the channel length is about the sum of the depth of the groove 408 and the length of the word line 411a (or the word line 411b) in the horizontal direction (indicated by x in FIG. 8C). When the depth of the groove 408 is larger than the feature size, the channel length is larger than the feature size, so that a short-channel effect can be suppressed.

In addition, the length x can be determined irrespective of the feature size. For example, when a necessary conductivity is ensured, the length x can be one half or less of the feature size, preferably one fourth or less of the feature size. At this time, the width of the groove 408 can be twice or less as large as the feature size, preferably equal to the feature size. As a result, the area of one memory cell can be 5 $F^2$, preferably 4 $F^2$.

For example, when the width of the groove 408 is 2 F and the length x is preferably less than or equal to 0.7 F, the word lines 411a and 411b which are formed in the same groove 408 can be separated from each other. As a result, a length needed for one memory cell is 2.5 F, and the area of one memory cell can be 5 $F^2$ which is the product of 2.5 F and 2 F which is a length (distance between sub bit lines) in a direction perpendicular to the line A-B (i.e., in a direction of the line E-F in FIGS. 9A to 9D).

Alternatively, when the width of the groove 408 is F and the length x is preferably less than or equal to 0.3 F, the word lines 411a and 411b which are formed in the same groove 408 can be separated from each other. As a result, a length needed for one memory cell is 2 F, and the area of one memory cell can be 4 $F^2$. This is a theoretical lower limit of a matrix memory cell array.

Note that providing the sub bit line 402 below the semiconductor region 409 makes it possible to obtain higher density and a smaller area as described above. If the sub bit line is provided over the word line, a larger area is necessary even when a method in which the word line is formed at the side surface of the groove 408 is employed. This is because it is necessary to provide a contact to the sub bit line in addition to the word line in the groove 408. Since the contact should not be in contact with the word line, it is indispensable that the width of the groove 408 is larger than F, actually larger than 2F.

<FIG. 8D>

A fifth insulator 412 is formed, and further, second contact plugs 413a and 413b connected to the conductive layers 407a and 407b are formed. The conductive layers 407a and 407b each function as an etching stopper, and the function is more effective when the semiconductor region 409 has a small thickness. A capacitor may be formed over the second contact plugs 413a and 413b and a bit line may be formed thereover as described in Embodiment 1.

This application is based on Japanese Patent Application serial no. 2011-020732 filed with Japan Patent Office on Feb. 2, 2011, the entire contents of which are hereby incorporated by reference.

What is claimed is:

1. A semiconductor memory device comprising:
   a sense amplifier circuit over a substrate;
   a sub bit line over the sense amplifier circuit;
   an island-shaped semiconductor region over the sub bit line;
   a word line and a capacitor over the island-shaped semiconductor region; and
   a bit line over the capacitor.

2. The semiconductor memory device according to claim 1, further comprising a circuit configured to drive the sense amplifier circuit below the sub bit line.

3. The semiconductor memory device according to claim 1, wherein the island-shaped semiconductor region comprises a portion formed on a side surface of a depressed portion or a projecting portion.

4. The semiconductor memory device according to claim 1, wherein the island-shaped semiconductor region comprises an oxide semiconductor.

5. The semiconductor memory device according to claim 1, wherein a capacitance of the capacitor is greater than or equal to 0.1 fF and less than or equal to 1 fF.

6. A semiconductor memory device comprising:
- at least one bit line;
- at least first to fourth word lines;
- at least a first memory block and a second memory block, each of the first memory block and the second memory block comprising:
  - at least two memory cells, each of the memory cells comprising at least one island-shaped semiconductor region and a capacitor, and
  - a sub bit line; and
- at least one sense amplifier circuit,
- wherein a first terminal of the sense amplifier circuit is connected to the sub bit line of the first memory block,
- wherein a second terminal of the sense amplifier circuit is connected to the sub bit line of the second memory block,
- wherein the sub bit line of the first memory block and the sub bit line of the second memory block are below the word lines, and
- wherein the bit line is over the word lines.

7. The semiconductor memory device according to claim 6, wherein the sub bit line of the first memory block and the sub bit line of the second memory block are formed in different layers.

8. The semiconductor memory device according to claim 6, wherein each of the first memory block and the second memory block comprises 64 or less memory cells.

9. The semiconductor memory device according to claim 6, further comprising a circuit configured to drive the sense amplifier circuit below the sub bit line.

10. The semiconductor memory device according to claim 6, wherein the island-shaped semiconductor region comprises a portion formed on a side surface of a depressed portion or a projecting portion.

11. The semiconductor memory device according to claim 6, wherein the island-shaped semiconductor region comprises an oxide semiconductor.

12. The semiconductor memory device according to claim 6, wherein a capacitance of the capacitor is greater than or equal to 0.1 fF and less than or equal to 1 fF.

13. A semiconductor memory device comprising:
- at least one bit line;
- at least first to fourth word lines;
- at least a first sub bit line and a second sub bit line; and
- at least one sense amplifier circuit,
- wherein each of the first sub bit line and the second sub bit line is connected to at least two memory cells, each of the memory cells comprising at least one island-shaped semiconductor region and a capacitor,
- wherein a first terminal of the sense amplifier circuit is connected to the first sub bit line,
- wherein a second terminal of the sense amplifier circuit is connected to the second sub bit line,
- wherein the first sub bit line and the second sub bit line are below the island-shaped semiconductor region, and
- wherein the bit line is over the word lines.

14. The semiconductor memory device according to claim 13, wherein the first sub bit line and the second sub bit line are formed in different layers.

15. The semiconductor memory device according to claim 13, wherein each of the first sub bit line and the second sub bit line is connected to 64 or less memory cells.

16. The semiconductor memory device according to claim 13, further comprising a circuit configured to drive the sense amplifier circuit below the first sub bit line and the second sub bit line.

17. The semiconductor memory device according to claim 13, wherein the island-shaped semiconductor region comprises a portion formed on a side surface of a depressed portion or a projecting portion.

18. The semiconductor memory device according to claim 13, wherein the island-shaped semiconductor region comprises an oxide semiconductor.

19. The semiconductor memory device according to claim 13, wherein a capacitance of the capacitor is greater than or equal to 0.1 fF and less than or equal to 1 fF.

* * * * *